United States Patent [19]
Tanabe et al.

[11] 4,292,618
[45] Sep. 29, 1981

[54] SEMICONDUCTOR STRAIN GAUGE WITH ELASTIC LOAD PLATE

[75] Inventors: Masanori Tanabe; Satoshi Shimada, both of Hitachi; Akio Yasukawa, Chiyoda; Motohisa Nishihara, Katsuta; Takeo Nagata, Hitachi, all of Japan

[73] Assignee: Hitachi, Ltd., Tokyo, Japan

[21] Appl. No.: 129,195

[22] Filed: Mar. 11, 1980

[30] Foreign Application Priority Data

Mar. 16, 1979 [JP] Japan .................................. 54-31294

[51] Int. Cl.³ .............................................. G01L 1/22
[52] U.S. Cl. ........................................ 338/5; 338/2; 357/26
[58] Field of Search ......................................... 338/2–5; 73/141 A, 141 R; 357/26; 29/610 SG

[56] References Cited

U.S. PATENT DOCUMENTS

| | | | |
|---|---|---|---|
| 3,184,962 | 5/1965 | Gay | 73/141 A X |
| 3,378,648 | 4/1968 | Fenner | 357/26 X |
| 3,662,234 | 5/1972 | Ishii | 357/26 |
| 4,200,856 | 4/1980 | Gilcher | 338/2 |

*Primary Examiner*—C. L. Albritton
*Attorney, Agent, or Firm*—Craig and Antonelli

[57] ABSTRACT

A semiconductor substrate has a major surface, another major surface on the opposite side of the first major surface, a strain gauge stripe formed in the central portion of the second major surface by diffusing an impurity therein, and electrodes connected to the strain gauge stripes. These strain gauge stripes are spaced from the peripheral edge of the second major surface by a distance greater than ⅓ of the length of the same major surface. The first major surface of the semiconductor substrate is bonded to an elastic metal load plate.

5 Claims, 4 Drawing Figures

SEMICONDUCTOR STRAIN GAUGE WITH ELASTIC LOAD PLATE

BACKGROUND OF THE INVENTION

The present invention relates to an improvement in a semiconductor strain gauge and, more particularly, to an improvement in a semiconductor strain gauge wherein a semiconductor substrate on which a strain gauge stripe is formed is bonded to an elastic load plate.

It is well known that a semiconductor strain gauge utilizing a piezoresistive effect of a semiconductor has output sensitivity several ten times as high as that of a conventional wire strain gauge. A known semiconductor strain gauge employs a semiconductor substrate having a strain gauge stripe formed on one major surface thereof by diffusion or epitaxial growth. A semiconductor strain gauge obtained by bonding such a semiconductor substrate to an elastic metal load is called a load plate type semiconductor strain gauge. This type of semiconductor strain gauge is described in, for example, the specification of U.S. Pat. No. 3,662,234 granted to Ishii on May 9, 1972.

A load plate type semiconductor strain gauge is advantageous in that, a load plate, even when it consists of a metal diaphragm or casing, permits a semiconductor substrate to be bonded thereto comparatively easily. However, the output of this type of semiconductor gauge is affected by a difference between the coefficient of thermal expansion of a semiconductor substrate and that of a metal load plate, the type of bonding agent inserted between the semiconductor substrate and metal load plate, and the bonding conditions. This causes a zero point drift and hysteresis in the output. Thus, the above-mentioned type of semiconductor strain gauge is not satisfactory with respect to its sensitivity, precision and reliability.

SUMMARY OF THE INVENTION

An object of the present invention is to provide a semiconductor strain gauge free from zero point drift and hysteresis in the output characteristics and having a high sensitivity, precision and reliability.

The characteristics of the present invention reside in that a strain gauge stripe is formed in the central portion of a major surface of a semiconductor substrate such that the distance between the strain gauge stripe and the periphery of the major surface of the semiconductor substrate is greater than ⅓ of the length of the major surface.

DESCRIPTION OF THE PREFERRED EMBODIMENT

Figure 1:
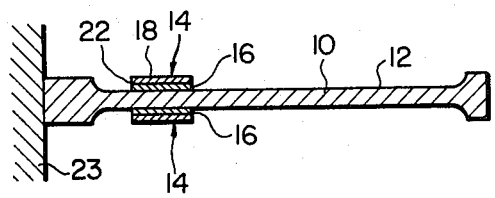
FIG. 1 is a sectional view of a semiconductor strain gauge embodying the present invention.
Figure 2:
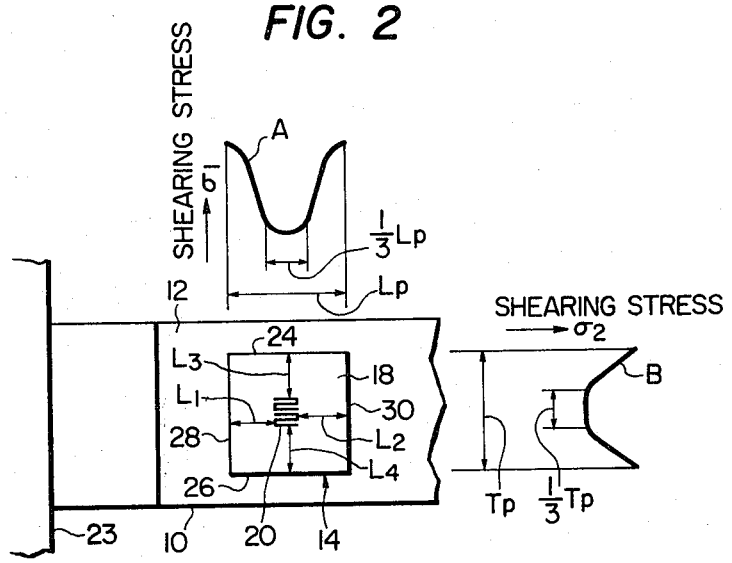
FIG. 2 is a schematic plan view of a semiconductor substrate used in the embodiment shown in FIG. 1.

Referring to FIGS. 1 and 2, a semiconductor substrate 14 is joined to the surface 12 of a metal load plate 10 by means of solder 16. A strain gauge stripe region 20 is formed on a major surface 18 of the semiconductor substrate 14. The other major surface 22 is bonded to the surface 12 of the metal load plate 10. The metal load plate 10 is secured at one end thereof to a fixed member 24, and is elastically deformed in accordance with a pressure and displacement to generate a stress in the surface 12.

Curves A, B in FIG. 2 represent the distribution of shearing stress received by the semiconductor substrate 14. Symbols Lp, Tp denote lateral and longitudinal lengths, respectively, of the semiconductor 14, and $\sigma_1$, $\sigma_2$ components of shearing stress. These curves A, B show that the components $\sigma_1$, $\sigma_2$ are greater in peripheral portions of the semiconductor substrate 14, and smallest in the central portion of the semiconductor substrate 14, which is substantially equidistant from the sides 24, 26, 28, 30 thereof. Namely, the curves A, B show that components $\sigma_1$, $\sigma_2$ are smaller in the central region of the substrate 14, the width of which is ⅓ times the length of the substrate 14.

According to results of experiments, zero point drift and hysteresis in the output characteristics of a semiconductor strain gauge are reduced as components $\sigma_1$, $\sigma_2$ are reduced.

In view of the above, the size of the strain gauge stripe region 20 in the present invention is selected as follows. The stripe region 20 is spaced from the longitudinal sides 28, 30 of the substrate 14 by distances $L_1$, $L_2$ which are greater than ⅓ of the length Lp of the lateral sides 24, 26 of the substrate 14, and from the lateral sides 24, 26 of the substrate 14 by distances $L_3$, $L_4$ which are greater than ⅓ of the length Tp of the longitudinal sides 28, 30 of the substrate 14. When a strain gauge stripe region 20 of the above-mentioned size is employed, zero point drift and hysteresis can be minimized since the stripe region 20 can be maintained at a low shearing stress.

Figure 3:
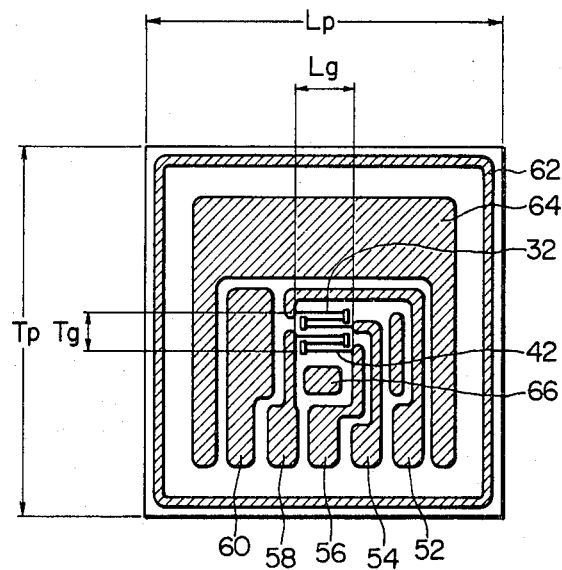
FIG. 3 is an enlarged plan view of the semiconductor substrate shown in FIG. 2, which shows the details of the same.
Figure 4:
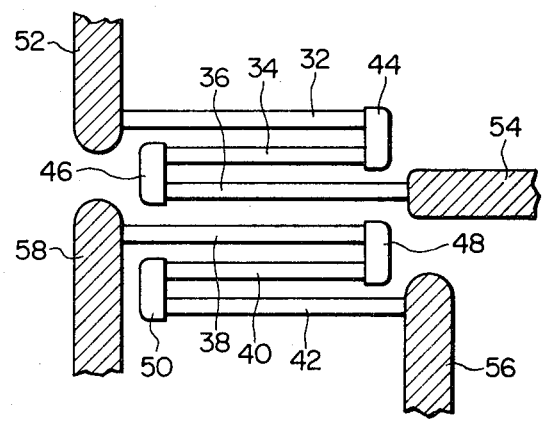
FIG. 4 is an enlarged plan view of a part of the semiconductor substrate shown in FIG. 3.

As shown in FIGS. 3 and 4, a semiconductor substrate 14 consists of a rectangular N-type silicone substrate having opposed major surfaces 18, 22 and 3.0 mm lateral sides 24, 26 and longitudinal sides 28, 30.

As shown in detail in FIG. 4, strain gauge stripes 32, 34, 36; 38, 40, 42 are formed in the central portion of the major surface 18 of the silicon substrate 14. The strain gauge stripes 32, 34, 36; 38, 40, 42 are extended parallel to the lateral sides 24, 26 of the silicone substrate 14, and the lengths Lg, Tg thereof are 0.480 mm and 0.310 mm, respectively. The crystal plane of this semiconductor substrate 14 is (111), and the strain gauge stripes 32, 34, 36; 38, 40, 42 are all formed parallel to the plane (111).

The strain gauge stripes 32, 34, 36; 38, 40, 42 are connected in series by low-resistance layers 44, 46; 48, 50, respectively, to retain an initial resistance value.

The number of strain gauge stripes is selected depending upon a permissible power consumption. When power consumption is small, the number of strain gauges is increased to obtain an increased initial resistance value.

The strain gauge stripes 32, 34, 36; 38, 40, 42 are formed on a major surface 18 of an N-type silicone substrate 14 by diffusing a p-type impurity therein.

Aluminum electrodes 52, 54, 56, 58 are formed by evaporation on the silicon substrate 14 as shown in FIG. 3. The strain gauge stripes 32, 34, 36 are connected in series between the electrodes 56, 58, and the strain gauge stripes 38, 40, 42 between the electrodes 56, 58.

In addition to the aluminum electrodes 52, 54, 56, 58, an aluminum electrode 60 is formed on the silicon substrate 14. The aluminum electrode 60 supplies a high potential to the silicon substrate 14 to improve the S/N ratio of the strain gauge.

Aluminum conductors 62, 64, 66 are also formed by evaporation on the silicon substrate 14. Accordingly, a bonding load is applied uniformly to the semiconductor substrate so that the thickness of solder 16 becomes uniform.

We claim:

1. A semiconductor strain gauge comprising an elastic load plate having a surface subject to stress; and a semiconductor substrate having opposed major surfaces one of which is bonded to said elastic load plate and the other of which is provided thereon with at least one strain gauge stripe, and electrodes connected to said strain gauge stripe, said strain gauge stripe being spaced from the peripheral edge of the latter major surface of said substrate by a distance which is at least ⅓ times the length of the latter major surface.

2. A semiconductor strain gauge according to claim 1, wherein said strain gauge stripe is formed by diffusing an impurity into said semiconductor substrate.

3. A semiconductor strain gauge comprising an elastic load plate having a surface subject to stress; and a semiconductor substrate having opposed major surfaces one of which is bonded to said elastic load plate and the other of which is provided with a plurality of strain gauge stripes formed substantially in the central portion thereof, and electrodes connected to said strain gauge stripes, said strain gauge stripes being arranged parallel to at least one of the longitudinal and lateral sides of the latter major surface of said semiconductor substrate such that said strain gauge stripes are spaced from the longitudinal sides of the latter major surface of said semiconductor substrate by a distance equal to at least ⅓ of the length of the lateral sides of the latter major surface of said substrate, and from the lateral sides by a distance equal to at least ⅓ of the length of the longitudinal sides, said strain gauge stripes being connected in series between said electrodes.

4. A semiconductor strain gauge according to claim 3, wherein said strain gauge stripes are formed by diffusing an impurity into said semiconductor substrate.

5. A semiconductor strain gauge according to claim 3, wherein the length of said strain gauge stripes is not greater than ⅓ of that of the latter major surface of said semiconductor substrate.

* * * * *